(12) United States Patent
Sakurai et al.

(10) Patent No.: US 6,947,103 B2
(45) Date of Patent: Sep. 20, 2005

(54) METHOD OF MAKING A REFLECTION TYPE LIQUID CRYSTAL DISPLAY DEVICE

(75) Inventors: Hiroshi Sakurai, Tokyo (JP); Hidenori Ikeno, Tokyo (JP); Yuichi Yamaguchi, Tokyo (JP); Hiroshi Kano, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 294 days.

(21) Appl. No.: 09/996,699

(22) Filed: Nov. 30, 2001

(65) Prior Publication Data

US 2002/0063825 A1 May 30, 2002

(30) Foreign Application Priority Data

Nov. 30, 2000 (JP) ........................................ 2000-364559

(51) Int. Cl.[7] ...................... G02F 1/1343; G02F 1/136; G09G 3/36; H01L 31/20; H01L 27/01
(52) U.S. Cl. .......................... 349/43; 349/38; 257/59; 257/72; 257/348; 345/92
(58) Field of Search ...................... 349/43, 38; 257/59, 257/72, 348; 345/92

(56) References Cited

U.S. PATENT DOCUMENTS

| | | | | |
|---|---|---|---|---|
| 5,728,592 A | * | 3/1998 | Oki et al. ................... | 438/161 |
| 5,834,328 A | * | 11/1998 | Jang ............................. | 348/30 |
| 5,907,008 A | * | 5/1999 | Nakano et al. ............. | 524/430 |
| 6,081,310 A | * | 6/2000 | Katsyya et al. ............. | 349/113 |
| 6,100,947 A | * | 8/2000 | Katayyama .................. | 349/38 |
| 6,317,173 B1 | * | 11/2001 | Jung et al. .................... | 349/43 |
| 2003/0022071 A1 | * | 1/2003 | Sugita et al. .................. | 430/5 |

FOREIGN PATENT DOCUMENTS

| | | |
|---|---|---|
| JP | 10-48669 | 2/1998 |
| JP | 10-319422 | 12/1998 |
| KR | 2001-28901 | 5/2000 |
| KR | 2000-57740 | 9/2000 |

* cited by examiner

*Primary Examiner*—Robert H. Kim
*Assistant Examiner*—Hoan C. Nguyen
(74) *Attorney, Agent, or Firm*—Young & Thompson

(57) ABSTRACT

A reflection type liquid crystal display device having excellent display capability even if the number of the photolithography process is reduced and a process for producing the device. A process includes the steps of (a) forming a source/drain wiring by using a first mask; (b) forming a thin film transistor region and gate wiring by using a second mask; (c) forming an opening for a transistor, in a passivation film by using a third mask; (d) forming a rough surface of the interlayer insulating film and to form an opening for the transistor by using a fourth mask by halftone exposure, and (e) forming a reflective metal which extend through the respective openings for the transistor in the passivation film and the interlayer insulating film so that it is electrically connected to the source wiring by using a fifth mask.

5 Claims, 18 Drawing Sheets

METHOD OF MAKING A REFLECTION TYPE LIQUID CRYSTAL DISPLAY DEVICE

FIELD OF THE INVENTION

The present invention relates to a reflection type liquid crystal display device and a process for manufacturing the same and in particular to a reflection type liquid crystal display device having excellent display characteristics even if a number of photolithography process(PR process) in a production is reduced and a process for producing the device.

BACKGROUND OF THE INVENTION

Reflection liquid crystal display devices have been used for portable cellular phones or intelligent terminals. The reflection liquid crystal display devices do not require any back light used for a light source since an externally entered incident light is reflected by a reflector disposed within the device and a reflected light is used as a display illumination light. As a result, the reflection type liquid crystal display devices are more effective to achieve reduction in power consumption, thickness and weight as compared with a transmitting type liquid crystal display device.

The structure of the reflection type liquid crystal display device mainly comprises a liquid crystal cell using TN (twisted nematic), one sheet polarization plate type, STN (supertwisted nematic)type, GH (guest host) type, PDLC (polymer dispersion) type, cholesteric type; elements for switching the liquid crystal cells and a reflector which is disposed internally or externally of the liquid crystal cell.

Such reflection type liquid crystal display devices can provide high definition and high quality images by adopting an active matrix drive system using thin film transistors or metal/dielectric film/metal structure diodes as transistors.

Provision of a reflector having optimal reflection characteristics is effective to increase the strength of light scattered in a direction normal to the display screen for light incident from a wide range of angles, so that brighter display can be obtained.

SUMMARY OF THE DISCLOSURE

In a conventional technique, manufacturing of reflection type liquid crystal display device, which is capable of bright and high quality display image, requires formation of both high performance transistors and high performance reflection plate on the same dielectric substrate. Accordingly, many film forming processes, photo-lithographic (hereinafter termed in an abbreviated form as "PR") and etching processes are necessary.

A conventional process for manufacturing a reflection plate to provide brighter display image has been proposed which comprises covering a plate with an interlayer dielectric film, roughing the surface of the interlayer dielectric film and forming a reflection film made up of silver and the like on the rough surface of the film (refer to, for example, Japanese Patent Kokai Publication JP-A-10-319422). A step in the process for manufacturing such a reflection type liquid crystal display is now explained. FIG. 18 is a flow chart illustrating a process for manufacturing an active matrix substrate in a prior art exemplary reflection type liquid crystal display device.

Referring now to FIG. 18, the process for manufacturing the active matrix substrate in the reflection type liquid crystal display device requires a total of 8 PR processes, that is, one PR for forming a gate bus wiring and gate electrode at step s1, one PR for forming a contact layer and semiconductor layer at step s3, one PR for forming a source, drain electrodes and source bus wiring at step s4, one PR for forming contact holes at step s6, one PR for applying a photoresist and its patterning, one PR for forming a convex at step s8, and one PR for forming a reflection electrode at step s9. The requirement of many number of PR processes provides a problem that the cost for manufacturing the reflection type liquid crystal display device is made higher, so that unit price is made higher.

It is demanded to provide of a reflection type liquid crystal display device having high brightness with a low cost, by reducing the number of PR process steps to reduce the manufacturing cost and by achieving high brightness and high quality display performance.

It is an object of the present invention to provide a reflection type liquid crystal display device having an excellent display capability even if the number of the PR process steps is reduced and a process for manufacturing the device.

In accordance with a first aspect of the present invention, a process for producing a reflection type liquid crystal display device comprises the steps of (a) depositing a metal layer having a low resistance on an insulating substrate to form source/drain electrodes by using a first mask; (b) stacking a silicon layer, gate insulating film and gate electrode layer on said insulating substrate including the source/drain electrodes in this order and using a second mask to form a thin film transistor region and a gate electrode; (c) depositing a passivation film on the insulating substrate including the source/drain electrodes, the thin film transistor region and the gate electrode, and using a third mask to form an opening through the passivation film; (d) depositing an interlayer film on the passivation film and forming a rough surface of the interlayer insulating film and using a fourth mask to form an opening in a position corresponding to the opening in the passivation film so that the openings extend through the interlayer insulating film; and (e) depositing a reflective metal over the rough surface of said interlayer insulating film to form, with using a fifth mask, a reflection electrode which extends through the respective openings for the transistor in the passivation film and the interlayer insulating film so that it is electrically connected to the source electrode.

In accordance with a second aspect of the present invention, a process for producing a reflection type liquid crystal display device comprises the steps of (a) depositing a metal layer having a low resistance on an insulating substrate to form source/drain electrodes by using a first mask; (b) stacking a silicon layer, gate insulating film and gate electrode layer on the insulating substrate including the source/drain electrodes in this order and using a second mask to form a thin film transistor region and gate electrode; (c) depositing a passivation film and an interlayer insulating film on the insulating substrate including the source/drain electrodes, the thin film transistor region and the gate wiring and using a third mask to form an opening, in position on the source electrode so that the opening extends through the interlayer insulating film; (d) forming an opening extending through the passivation film in a position corresponding to the opening in the interlayer insulating film by using the interlayer insulating film as a mask; (e) depositing a reflective metal over the rough surface of said interlayer insulating film to form, by using a fifth mask, a reflection electrode which extends through the respective openings in the passivation film and the interlayer insulating film so that the reflection electrode is electrically connected to the source electrodes.

In the process for producing a reflection type liquid crystal display device, it is preferable that the formation of the rough surface of said interlayer insulating film and the opening for the transistor is conducted by halftone exposure and two-times exposure.

In the process for producing a reflection type liquid crystal display device, it is preferable that the formation of the rough surface of said interlayer insulating film and the opening for the transistor is conducted by using an exposure mask, the transmissivity of which is controlled.

In accordance with a third aspect of the present invention, the process for producing a reflection type liquid crystal display device is characterized in that a capacitor electrode is formed when said source/drain wiring is formed, in that said gate wiring is formed on said insulating substrate including said capacitor electrode when said thin film transistor region and said gate wiring are formed; in that an opening for a storage capacitor extending through said interlayer insulating film and said passivation film is formed in position on said capacitor electrode when the openings for the transistor is formed through said interlayer insulating film and said passivation film; and in that said reflection electrode extending through the openings for the storage capacitance in said passivation film and said interlayer insulating film is formed so that it is electrically connected to said capacitor electrode when said reflection electrode is formed.

In accordance with a fourth aspect of the present invention, the process for manufacturing a reflection type liquid crystal display device is characterized in that a source/drain wiring for a protective circuit is formed when said source/drain wirings are formed; in that a protective electrode and protective wiring are formed when said thin film transistor region and said gate wiring are formed; in that said passivation film and said interlayer insulating film are formed on said insulating substrate including the source/drain wiring, said protective electrode and said protective wiring for said protective circuit when said passivation film and said interlayer insulating film are formed; in that openings for the protection circuit extending through said passivation film and said interlayer insulating film are formed in position on said drain wiring when respective openings for the transistor of said interlayer insulating film and said passivation film are formed; and in that a first shortening wiring which extends through given opening for said protective circuit for electrically connecting the source/drain wiring for said protective circuit to said protective wiring is formed from said reflective metal and a second shortening wiring which extends through given opening for said protective circuit for electrically connecting said drain wiring to said protective electrode is formed when said reflection electrode is formed.

In the process for producing a reflection type liquid crystal, it is preferable that said process further includes the step of heat treating at least the rough surface of said interlayer insulating film prior to depositing said reflective metal after the rough surface of said interlayer insulating film has been formed.

In the process for producing a reflection type liquid crystal display device, it is preferable that said process further includes the step of treating at least said source/drain wiring with $PH_3$ prior to successive deposition of said silicon layer, gate insulating film and gate electrode layer after said source/drain wiring has been formed.

In accordance with a fifth aspect of the present invention, the reflection type liquid crystal display device comprises a source/drain wiring which is formed in position on an insulating substrate; a thin film transistor region and gate wiring which are formed of a stack in which a silicon layer, a gate insulating film and a gate electrode metal layer are deposited in position on said insulating substrate including said source/drain wiring in such a manner that they are stacked in this order as viewed in a direction substantially normal to said substrate; a passivation film which is formed on said insulating substrate including said source/drain wiring, said thin film transistor region and said gate wiring so that it has an opening for a transistor extending through said source wiring in position; an interlayer insulating film which is formed on said passivation film and has a rough surface and an opening for the transistor which is formed to extend through said interlayer insulating film in position corresponding to the opening for the transistor of said passivation film simultaneously with the formation of the rough surface; and a reflection electrode which is formed on said interlayer insulating film an has a roughness over the surface of said interlayer insulating film and extends through respective openings of said passivation film and said interlayer insulating film so that it is electrically connected to said source wiring.

In accordance with a sixth aspect of the present invention, the reflection type liquid crystal display device is characterized in that said device comprises a capacitor electrode which is formed in position on an insulating substrate simultaneously with the formation of said source/drain wiring; and a storage capacitor which is formed simultaneously with the formation of said thin film transistor from a stack in which a silicon layer, gate insulating film and gate electrode metal layer are deposited in position on said insulating substrate including said capacitor electrode so that they are stacked in a direction normal to said substrate; in that said passivation film is formed on said insulating substrate including said storage capacitance and has an opening for the storage capacitance which is formed simultaneously with the formation of the opening for the transistor in said passivation film so that it extends through said passivation film in position; in that said interlayer insulating film has an opening for the storage capacitance which is formed simultaneously with the formation of said rough surface so that it extends through said interlayer film; and in that said reflection electrode extends through respective openings for the storage capacitor in said passivation film and said interlayer insulating film so that it is electrically connected to said capacitor electrode.

In accordance with a seventh aspect of the present invention, the reflection type liquid crystal display device is characterized in that said device comprises a source/drain wiring for the protective circuit which is formed in position on said insulating substrate simultaneously with the formation of said source/drain wiring; and a protective electrode and protective wiring which are formed simultaneously with the formation of said thin film transistor region of a stack in which a silicon layer, gate insulating film and gate electrode metal layer are successively deposited in position on said insulating substrate including a source/drain wiring for said protective circuit so that they are stacked in a direction substantially normal to said substrate; in that said passivation film is formed on said insulating substrate including said protective electrode and said protective wiring and has an opening for the protective circuit which is formed simultaneously with the formation of the opening for the transistor in said passivation film and extends through said passivation film in position on said drain wiring, said source/drain wiring of said protective circuit, said protective electrode and said protective wiring; in that said interlayer insulating film has an opening for the protective circuit which is formed simultaneously with the formation of said rough surface in position corresponding to the opening for the protective circuit in said passivation film so that it extends through said interlayer insulating film; and in that said device further includes a first shortening wiring which is formed in position on said interlayer insulating film simultaneously with the formation of said reflection electrode and extends through respective openings for the protective circuit in said passivation film and said interlayer insulating film so that it is electrically connected to said source/drain wiring for said protective circuit and said protective wiring; and a second shortening wiring which is formed in position on said interlayer insulating film simultaneously with the formation of said reflection electrode and extends through respective openings for the protective circuit in said passivation film and said interlayer insulating film so that it is electrically connected to said drain wiring for said protective circuit and said protective electrode.

In the reflection type liquid crystal display device, it is preferable that said source/drain wiring, said capacitor electrode or said source/drain wiring for said protective circuit is treated with $PH_3$.

In accordance with another aspect of the present invention, there is provided a process for producing an active matrix substrate for use in a liquid crystal display device on which a reflector electrode formed on an insulating film has a contact to a source electrode of a switch transistor arranged on a cross region of a gate bus line and a drain bus line, comprising the steps of:

depositing a photo-sensitive insulating film adapted for an interface to said reflector electrode on the substrate having said switch transistor, said drain bus line and said gate bus line formed thereon; and forming a rough interface of said photo-sensitive layer and a contact hole penetrating through said photo-sensitive layer by using one of a halftone exposure method and two-times exposure method.

The process in accordance with another aspect of the present invention, further comprises the steps of: forming a contact hole extending to said source electrode through an insulating film inserted between said substrate and said photo-sensitive layer by using said photo-sensitive layer as an etching mask.

The process in accordance with another aspect of the present invention, further comprises the steps of: depositing a silicon layer, an gate insulating film and a gate electrode layer on an insulating substrate having a source and drain electrode pattern formed thereon;

forming a pattern of a gate electrode and a gate bus line using a photolithography process and an etching process of the gate electrode layer, accompanied by successive etchings of the gate insulating film and silicon layer to form a staggered structure of said switch transistor.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
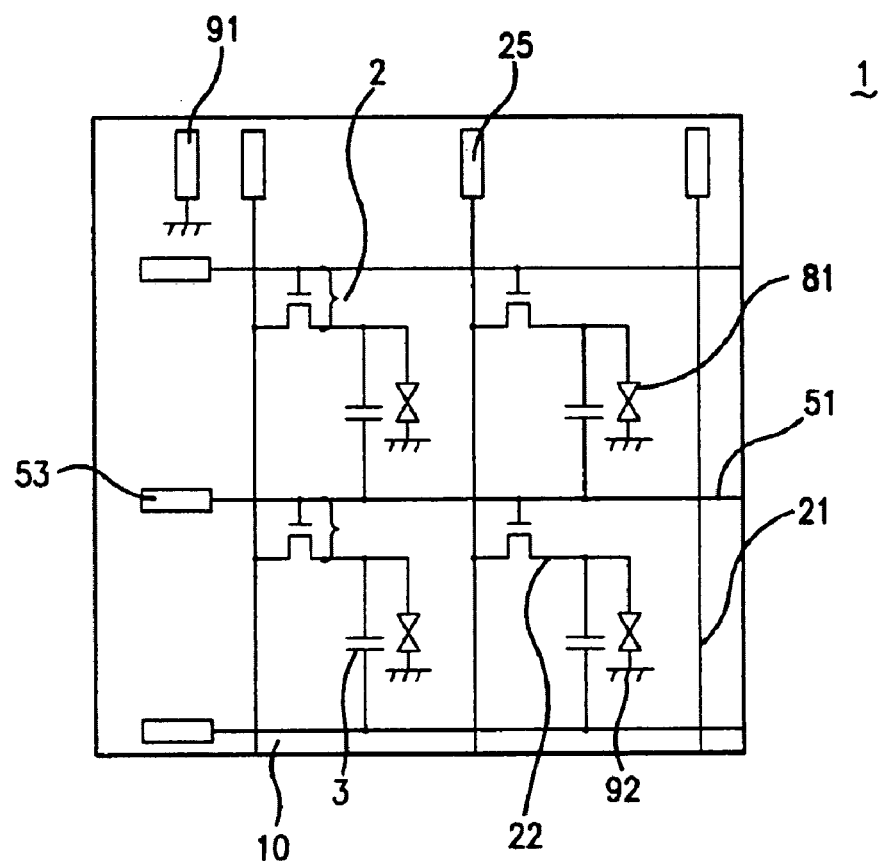
FIG. 1 is a circuit diagram showing the active matrix substrate in the reflection type liquid crystal display device of the embodiment 1 of the present invention.

Preferred embodiments of the invention will be now described. In accordance with one preferred embodiment of the present invention, a process of making a reflection type liquid crystal display device comprises the steps of:

(a) depositing a metal layer having a low resistance on an insulating substrate(10) to form a source/drain electrode(22,23) by using a first mask;

(b) stacking a silicon layer(30), gate insulating film(40) and gate electrode layer(52) in this order on the insulating substrate(10) having the source/drain electrode formed to form a thin film transistor region and a gate electrode by using a second mask;

(c) depositing a passivation film(61) on the insulating substrate including the source/drain electrode, the thin film transistor region and the gate electrode to form an opening(63) for a transistor, in a predetermined position on the source electrode(22) by using a third mask so that the opening penetrates through the passivation film;

(d) depositing an interlayer film(62) on the passivation film(61) to form a rough surface of the interlayer insulating film and to form an opening for the transistor in a position corresponding to the opening for the transistor in the passivation film by using a fourth film so that the opening penetrates through the interlayer insulating film(62); and (e) depositing a reflective metal layer over the rough surface of the interlayer insulating film(62) to form, by using a fifth mask, a reflection electrode(71) which penetrates through the respective openings for the transistor in the passivation film(61) and the interlayer insulating film(62) so that reflection electrode(71) is electrically connected to the source electrode(22).

Accordingly, this manufacturing process requires only total 5 PR processes since the formation of the source/drain electrode until the formation of the reflection electrode. The number of the process steps can be remarkably reduced in comparison with those in prior art manufacturing process.

A process for manufacturing a reflection type liquid crystal display device comprises the steps of:

(a) depositing a metal layer having a low resistance on an insulating substrate(10) to form a source/drain electrode(22,23) by using a first mask;

(b) stacking a silicon layer(30), gate insulating film(40) and gate electrode layer(52) in this order on said insulating substrate(10) including said source/drain electrode to form a thin film transistor region and gate electrode by using a second mask;

(c) depositing a passivation film(61) and interlayer insulating film(62) on said insulating substrate including said source/drain electrode, said thin film transistor region and said gate electrode to form, by using a third mask with a half tone exposure method, a rough surface of said interlayer insulating film(62) and an opening for a transistor, in a predetermined position on said source electrode(22) so that the opening penetrates through said interlayer insulating film(62);

(d) forming an opening(63) for the transistor penetrating through said passivation film(61) in a position corresponding to the opening for the transistor in said interlayer insulating film by using said interlayer insulating film(62) as a mask;

(e) depositing a reflective metal over the rough surface of said interlayer insulating film to form, by using a fifth mask, a reflection electrode(71) which extend through the respective openings for the transistor in said passivation film(61) and said interlayer insulating film(62) so that it is electrically connected to said source electrode.

Accordingly, the manufacturing process requires only total of four PR processes since the formation of the source/drain electrode until the formation of the reflection electrode. The number of PR process steps can be further reduced.

It is possible to simultaneously form the capacitor electrode and protective circuit without increasing the number of PR process steps.

Embodiments of the present invention will be described with reference to the drawings. FIG. 1 is a schematic diagram of an active matrix substrate of a reflection type liquid crystal display device of the first embodiment of the present invention. FIGS. 2 to 6 are top plan views each schematically showing a layout in a process for manufacturing an active matrix substrate in the reflection type liquid crystal display device of the first embodiment of the present invention with only one pixel being illustrated. FIG. 7a to 7e are cross sectional views taken along the line A–A' in FIGS. 2 to 6 schematically showing the process for manufacturing transistors of the active matrix substrate in the reflection type liquid crystal display device of the first embodiment of the present invention. FIGS. 8a to 8e are cross sectional views taken along the line B–B' of FIGS. 2 to 6 schematically showing a step for manufacturing a storage capacitor unit of the active matrix substrate in the reflection type liquid crystal display device of the first embodiment of the present invention.

The active matrix substrate in accordance with the first embodiment is a substrate for the reflection type liquid crystal display device in which the liquid crystal is driven by a reflection electrode provided on the active matrix substrate and a transparent electrode provided on a substrate opposite to the active matrix substrate. The active matrix substrate comprises staggered structure thin film transistors (TFT) (top gate type).

As shown in circuit diagram of FIG. 1, the active matrix substrate 1 comprises a plurality of gate bus lines 51 and a plurality of drain bus lines 21 which intersect to each other on the insulating substrate 10, a plurality of transistors which are disposed at the intersections of the bus lines, and a reflection electrode (not shown). The plurality of gate bus lines 51 and drain bus lines 21 are terminated at the periphery of the insulating substrate 10 and are provided with gate terminals 53 and drain terminals 25, respectively to which drive signals are supplied externally of the substrate. A common potential supply terminal 91 is formed at a corner of the insulating substrate 10. The common potential supply terminal 91 is configured to supply a common potential to a common electrode 92 on an opposite substrate (not shown) which is opposite to the active matrix substrate 1 for sandwiching a liquid crystal 81 therebetween. A storage capacitor 3 is formed between each of transistors 2 and the adjacent gate bus line 51 for keeping the potential stored in the pixel constant for a period of one frame.

As shown in FIG. 7, the structure of the transistor of the active matrix substrate in this embodiment comprises source/drain electrodes 22 and 23 which are located on the insulating substrate 10, and a laminate structure which is made up of a silicon layer 30 which functions as an active layer, a gate insulating film 40 and a gate electrode 52, covering opposing sides of the source/drain electrodes 22 and 23 and the insulating substrate 10 located between the opposing source/drain electrodes 22 and 23 in such a manner that they are stacked. A passivation film 61 covers over the insulating substrate 10 including the transistor 2 which is formed of the source/drain electrodes 22 and 23, silicon layer 30, gate insulating film 40 and the gate electrode 52. An inter-layer dielectrics 62 having a rough surface is formed on the passivation layer 61. A contact hole 63 is formed in a position on the source electrode 22 to penetrate through the passivation film 61 and the inter-layer dielectrics film 62. A reflection electrode 71 is formed on the inter-layer dielectrics film 62. The reflection electrode 71 which is formed through the contact hole 63 to reach the source electrode 22 is electrically connected to the source electrode 22. The gate electrode 52 in the stack structure made up of the silicon layer 30, the gate insulating film 40 and the gate electrode corresponds to the gate bus line 51 and the gate electrode 52 in FIG. 3. The drain electrode 23 corresponds to the drain bus line 21 in FIGS. 2 and 3.

Now, a process for manufacturing the active matrix substrate in the reflection type liquid crystal display device will be described with reference to FIGS. 2 and 8.

Figure 2:
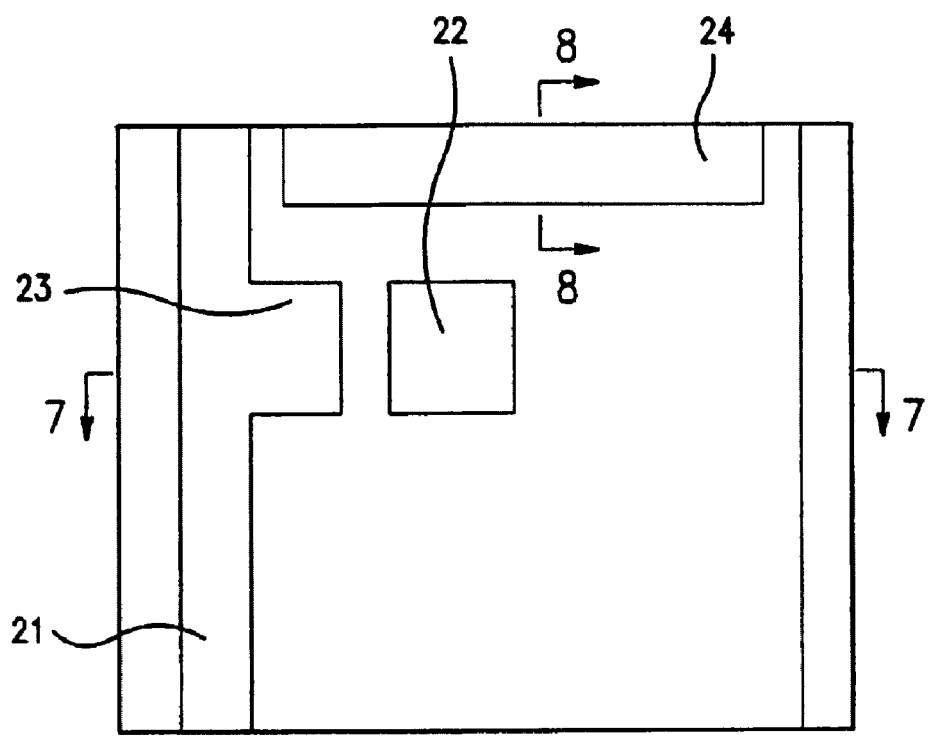
FIG. 2 is a first top plan view schematically showing the process for manufacturing the active matrix substrate in the reflection type liquid crystal display device of the embodiment 1 of the present invention.
Figure 7A:
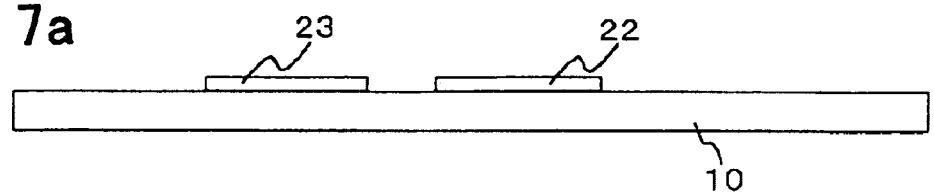
FIGS. 7a to 7d are sectional views each taken along the line 7—7 schematically showing the process for manufacturing the transistors in active matrix substrate in the reflection type liquid crystal display device of the embodiment 1 of the present invention.
Figure 8A:
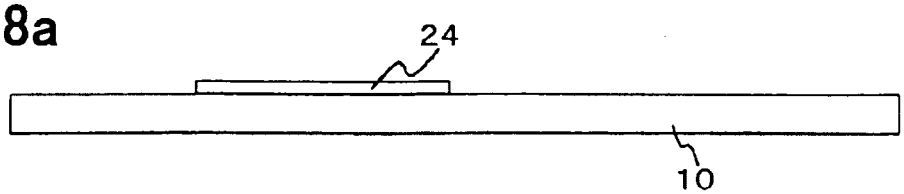
FIGS. 8a to 8e are sectional views each taken along the line 8—8 schematically showing the process for manufacturing the storage capacitor of the active matrix substrate in the reflection type liquid crystal display device of the embodiment 1 of the present invention.

As shown in FIGS. 2, 7a and 8a, a source/drain electrode layer made up of a metal having a low resistance(high conductivity) such as Cr, Mo, Ta with a thickness of about 150 nm (1500 Angstrom) is deposited on the insulating substrate made up of $SiO_2$ and the like. The source/drain electrodes 22 and 23 including the drain bus line 21 and a capacitor electrode 24 which is separated therefrom are formed to their respective layout patterns by a PR and etching process. The source/drain electrode layer can be formed by depositing a Cr film, using for example a sputtering process under conditions of temperature of 150° C.; pressure of 0.3 Pa and power of 7 kW by supplying Ar gas at a flow rate of 100 sccm. Pattern formation of the source/drain electrodes and the like can be achieved by etching the Cr film with a solution containing 5% of ceric nitrate and 20% of nitric acid at 40° C. for 100 seconds by using a wet etching process.

After the formation of the source/drain electrodes 22 and 23, the source/drain electrodes 22 and 23 are preferably treated with $PH_3$ (not shown). $PH_3$ processing of these electrodes can be performed for example by using a plasma CVD process under conditions of RF power of 50 W, pressure of 150 Pa, temperature of 250° C. for 60 seconds by supplying $PH_3$ gas at a flow rate of 1000 sccm. The processing with $PH_3$ causes phosphorus to be selectively deposited on the source/drain electrodes. When a film of a-Si is subsequently formed, a film of $n^+$a-Si is formed at the metal/a-Si interface, resulting in that an excellent connection is obtained and the resistance at the metal/a-Si interface is reduced.

Figure 3:
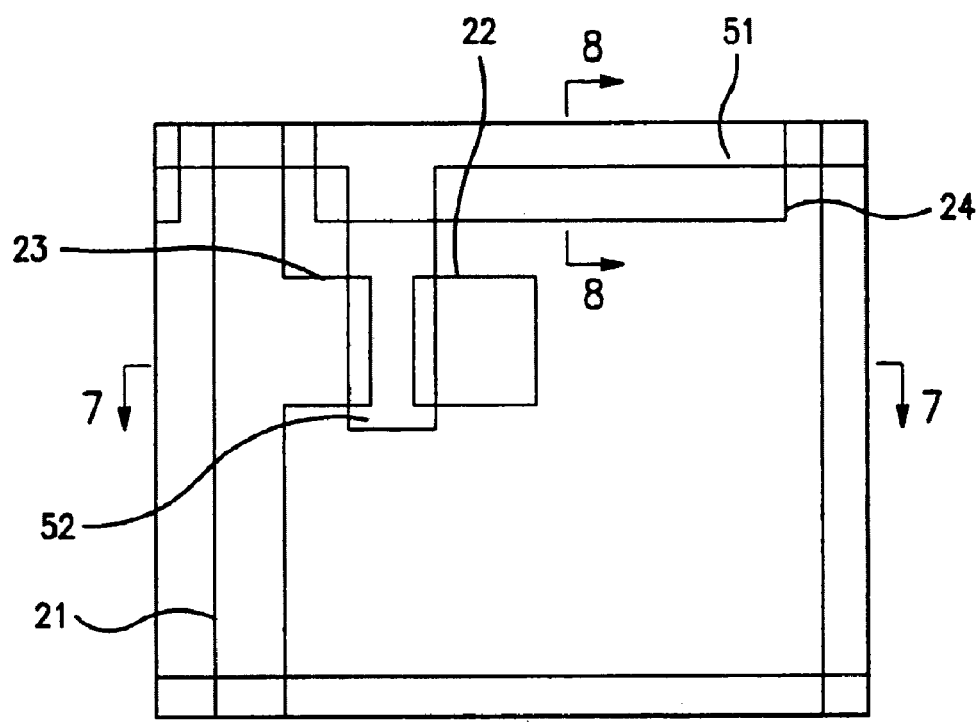
FIG. 3 is a second top plan view schematically showing the process for manufacturing the active matrix substrate in the reflection type liquid crystal display device of the embodiment 1 of the present invention.
Figure 7B:
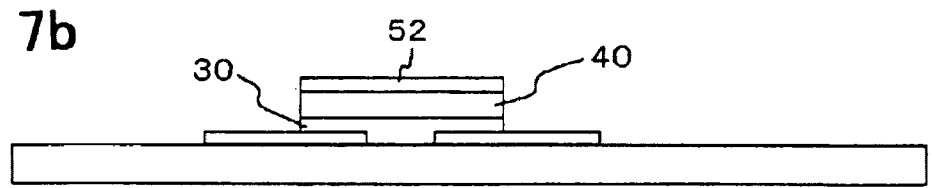
Figure 8B:
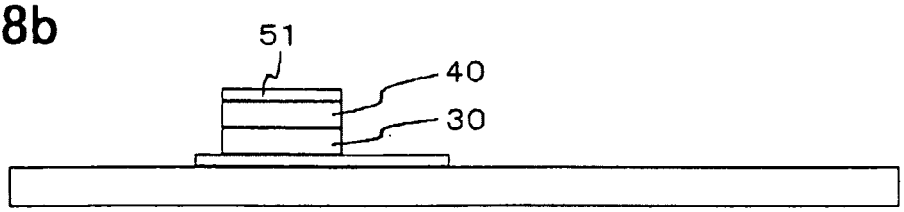

The silicon layer 30 of a-Si (amorphous Silicon) or the like having a thickness of about 30 nm (300 Angstrom) is formed on the insulating substrate 10 to cover the source/drain electrodes 22 and 23 (including the drain bus line 21 and capacitor electrode 24) as shown in FIGS. 3, 7b and 8b. Then, the gate insulating film 40 preferably made up of $SiN_x$ or $SiO_2$ and the like having a thickness of about 50 nm (500 Angstrom) is formed on the silicon layer 30. Then, the gate electrode layer 52 preferably made up of a metal such as Cr, Mo, and Ta is formed on the gate insulating film 40. The stack structure(including the gate bus line 51) in which the silicon layer 30, gate insulating film 40 and the gate electrode 52 are successively deposited is formed by etching away the silicon layer, gate insulating film and gate electrode layer in undesired areas by a PR process and etching process. The $PH_3$ processing and formation of the silicon layer and the gate insulating film are successively conducted in this order. The formation of the silicon layer and gate insulating film are sequentially conducted in this order. The formation of the gate insulating film 40 successive to the formation of the silicon thin film provides an advantage over an inverted staggered structure TFT in which etching is conducted immediately after the formation of the silicon layer 30 in that the silicon layer 30 can be prevented from being contaminated. Such a continuous etching requires only one PR process to form the stack structure comprising the silicon layer 30, gate insulating film 40 and the gate electrode layer 52, resulting in the simplification of the manufacturing process.

The deposition of a-Si layer may be conducted by using for example, a plasma CVD method, under conditions of RF power of 50 W, pressure of 100 Pa, and temperature of 250° C. with supplying $SiH_4$ and $H_2$ gases at a flow rate of 300 and 800 sccm, respectively.

The deposition of $SiN_x$ layer as the gate insulating film may be conducted by using for example a plasma CVD method under conditions of RF power of 500 W, pressure of 200 Pa and temperature of 250 C. with supplying $SiH_4$, $NH_3$ and $N_2$ gases at a flow rate of 30, 80 and 850 sccm, respectively.

The film of the gate electrode layer can be formed by depositing a metal layer of Cr by using for example a sputtering process under conditions of RF power of 7 kW, pressure of 0.3 Pa and temperature of 150° C. with supplying Ar gas at a flow rate of 100 sccm using.

The pattern formation of the gate electrode can be conducted by using for example a wet etching method in which the Cr film undergoes etching in a solution with 5% of ceric nitrate, and 20% of nitric acid at 40° C.

The pattern formation of the gate insulating film in the stack structure can be conducted by using for example a dry etching method in which the $SiN_x$ layer undergoes etching with $SF_4$ and He gases being supplied at a flow rate of 50 and 150 sccm, respectively under conditions of RF power of 1200 W and pressure of 30 Pa for 500 seconds.

The pattern formation of the silicon layer in the stack structure can be conducted by using for example a dry etching method in which the a-Si layer is processed with $SF_4$, He and HCl gases supplied at a flow rate of 200, 300 and 200 sccm under condition of RF power of 850 W and pressure of 30 Pa for 10 seconds.

Figure 4:
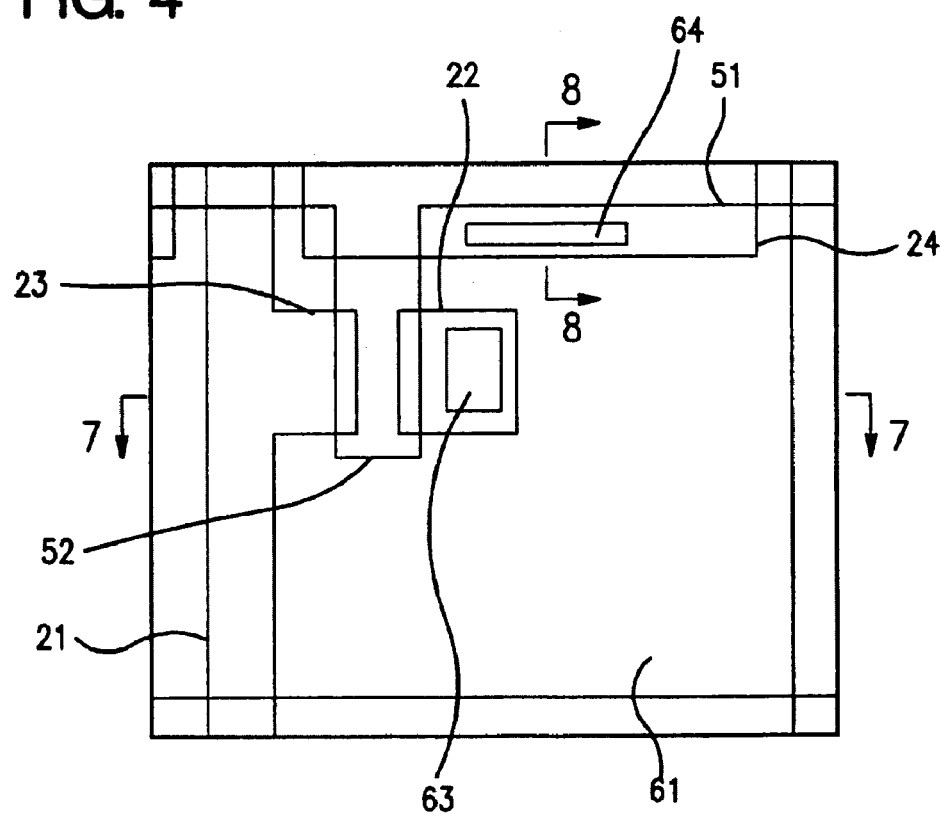
FIG. 4 is a third top plan view schematically showing the process for manufacturing the active matrix substrate in the reflection type liquid crystal display device of the embodiment 1 of the present invention.
Figure 7C:
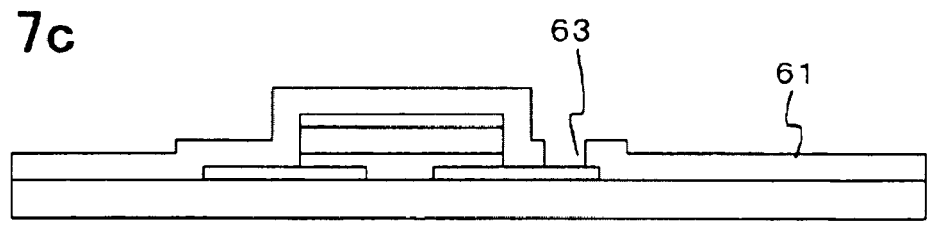
Figure 8C:
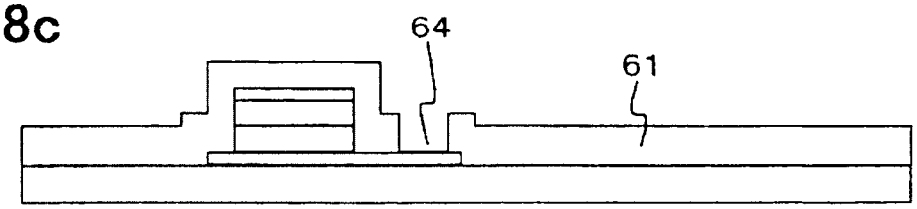

Subsequently, as shown in FIGS. 4, 7c and 8c, the passivation film 61 of $SiN_x$, etc. having a thickness of about 250 nm (2500 Angstrom) is deposited on the insulating substrate 10 so that it covers the transistor 2, drain bus line 21 and gate bus line 51. Then, the contact holes 63 and 64 which penetrate through the passivation film 61, are formed by a photolithography and etching process in positions on the source electrode 22 and capacitor electrode 24, respectively.

The deposition of the passivation film can be conducted by using for example a plasma CVD method under conditions of RF power of 1200 W, pressure of 180 Pa, and temperature of 250°C. by supplying $SiH_4$, $NH_3$ and $H_2$ gases at a flow rate of 200, 1000 and 1000 sccm, respectively.

The contact holes in the passivation film can be formed for example using a dry etching method in which the $SiN_x$ layer is processed under conditions RF power of 1200 W and pressure of 7 Pa for 1000 seconds with supplying $SF_4$ and He gases at a flow rate of 50 and 150 sccm, respectively. Although the composition of the gate insulating film is identical with that of the passivation film for the sake of convenience of a process control and practice, they may be different to each other depending upon the required characteristics if necessary.

Figure 5:
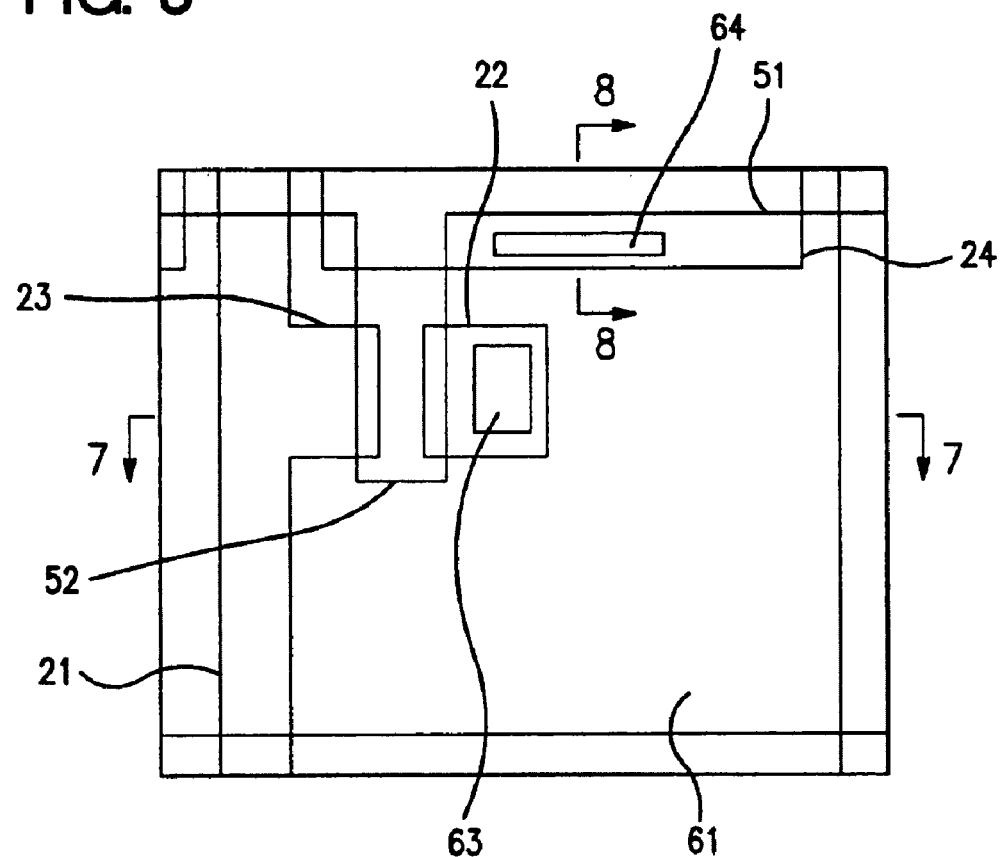
FIG. 5 is a fourth top plan view schematically showing the process for manufacturing the active matrix substrate in the reflection type liquid crystal display device of the embodiment 1 of the present invention.
Figure 7D:
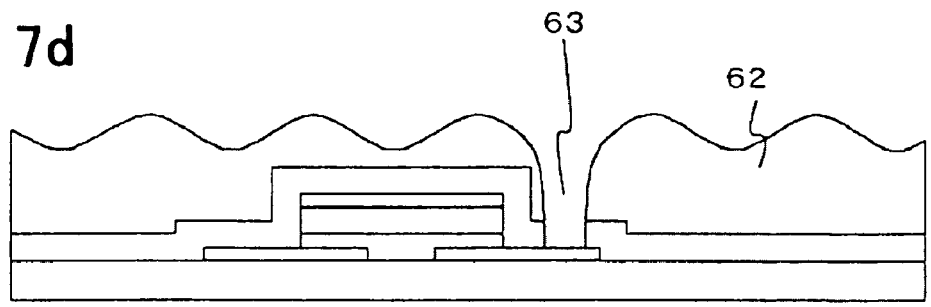
Figure 8D:
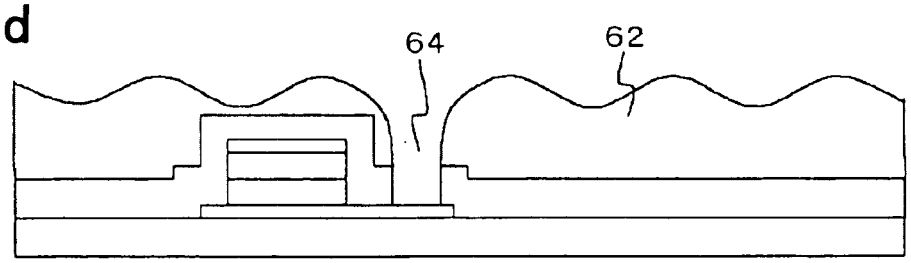

Subsequently, as shown in FIGS. 5, 7d and 8d, the inter-layer dielectrics 62 of organic materials such a photosensitive acrylic resin and polyimide resin having a thickness of about 3 μm (maximum thickness) is deposited on the passivation film 61. The inter-layer dielectrics 62 is roughed on its surface and the contact holes 63 and 64 which penetrate through the inter-layer dielectrics 62 are formed in positions on the source electrode 22 and capacitor electrode 24 by for example a photolithography and etching process using half tone exposure and two-times exposure.

The inter-layer dielectrics film can be formed by spin-coating the substrate with the photosensitive acrylic resin (339L manufactured by JSR Co., Ltd.) at 500 r.p.m., pre-baking the substrate at 90°C. for 240 seconds and thereafter exposing it to light at a scan speed of 15 mm/sec with an exposing apparatus (MPA 3000 W manufactured by Cannon Co., Ltd.).

The rough surface of the inter-layer dielectrics and the contact holes can be formed by treating the substrate under conditions of 0.2% of TMAH, and temperature of 25° C. for 100 seconds by a half-tone exposure method in which an exposure mask, the transmissivity of light of which is controlled is used. The exposure mask is preferably formed of amorphous silicon (having an optical band gap of 1.8 eV), the light transmissivity of which is changed depending upon the thickness. The amorphous silicon film can be formed by the deposition of a silicon film having a thickness of 0.15 μm on a glass substrate serving as a mask substrate using a plasma chemical vapor deposition (PECVD) method) and then patterning of the deposited silicon film to a desired pattern by a photolithography and etching process. The transmissivity of the amorphous silicon for light having a wavelength of 436 nm can be controlled in the range of 100 to about 0.1% by changing the film thickness in the range of 0.1 to 1.5 μm. The mask may be configured so that it has a desired concave or convex to be formed on the surface of the reflection plate, the pitch of 2 to 30 μm, the form of circular and the cross-section having an inclination angle of 30 degrees or less.

On formation of the rough surface of the inter-layer dielectrics film and contact holes by using a two-times exposure method, a first exposure to light is conducted by using a first mask at such an exposing rate so that a half of the photo-sensitive film can be removed and a second exposure is conducted using a second mask at the same exposing rate. A portion of the film, which is subjected to both the first and second exposure, is completely removed and a half of the thickness is removed in a portion, which is subjected to either of the first or second exposure. In such a manner, a residual film having a step form can be obtained.

If the inter-layer dielectrics film is formed from acrylic resin, it is preferable to make the rough surface smooth by conducting a heat treatment at 220° C. for one hour after the formation of the rough surface. The inter-layer dielectrics film may be formed by any methods, and the method having a minimum number of steps is preferable adopted for the economy of process.

Figure 6:
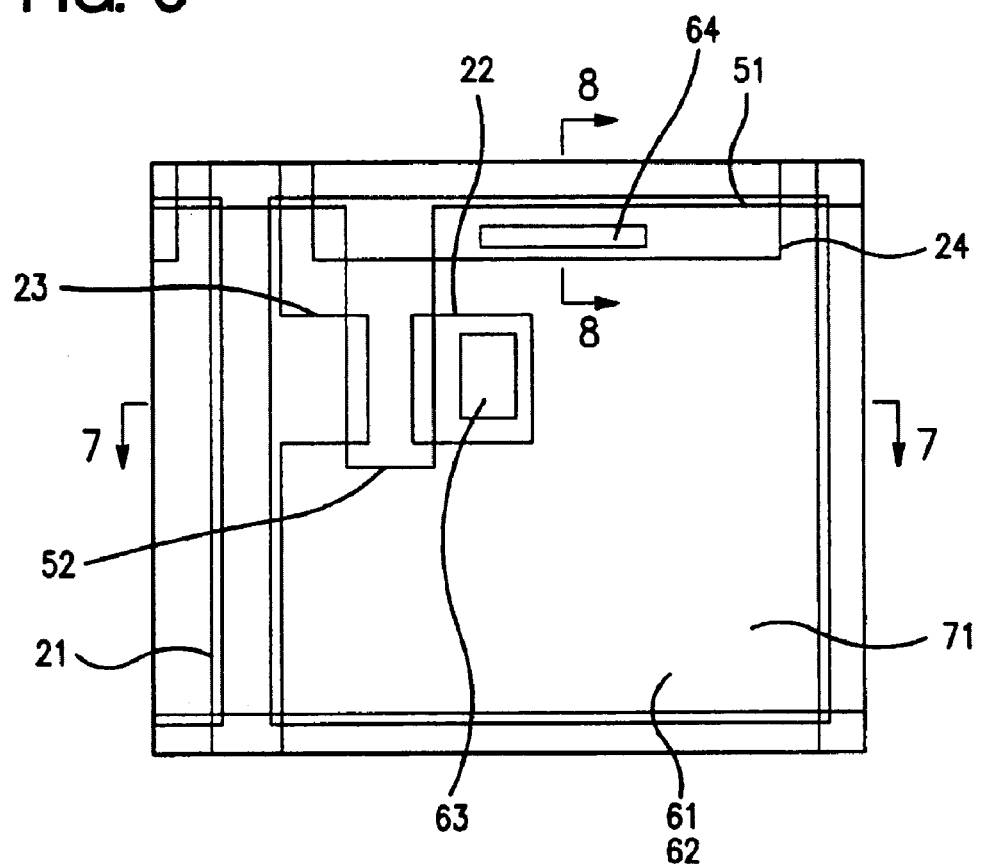
FIG. 6 is a fifth top plan view schematically showing the process for manufacturing the active matrix substrate in the reflection type liquid crystal display device of the embodiment 1 of the present invention.
Figure 7E:
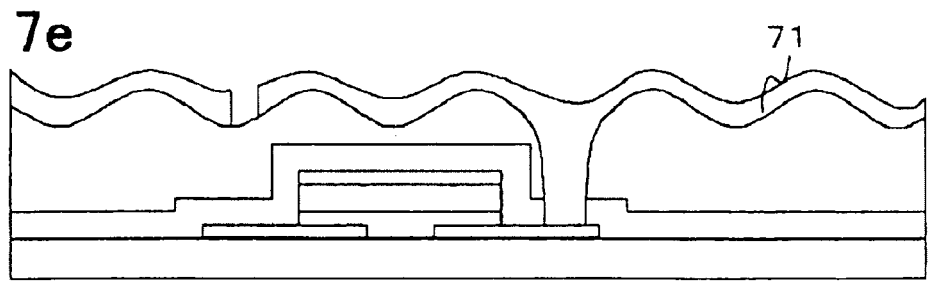
Figure 8E:
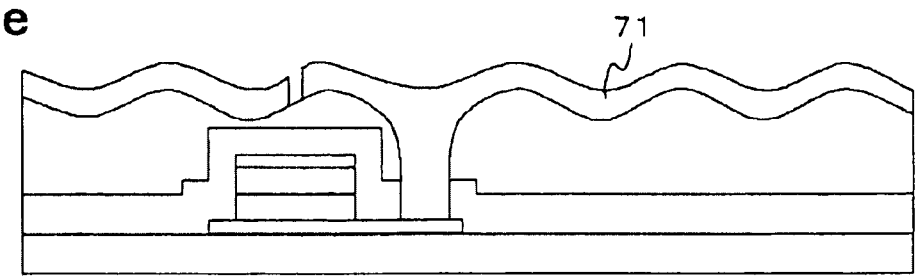

Subsequently, as shown in FIGS. 6, 7e and 8e, a reflection electrode layer of a highly reflective material such as Al, Ag having a thickness of about 300 nm (3000 Angstrom) measured from the rough surface of the interlayer insulating film 62 is deposited on the inter-layer dielectrics 62 so that it extends through the contact holes 63 and 64 and is connected to the drain electrode 23 and the capacitor electrode 24 and the reflection electrode 71 is pattern-formed by using a photolithography and etching processes. The reflection electrode 71 is formed at least in an aperture (opening) of the liquid crystal panel. This reflection electrode 71 may be formed so that it is partially overlapped at its periphery on the transistor 2, gate bus line 51 and drain bus line 21. With the steps mentioned above, the active matrix substrate is made.

The reflection electrode layer can be formed with a depositing of an Al layer by using for example a sputtering process with conditions of temperature of 200° C., pressure of 0.3 Pa and power of 5 kW, supplying Ar gas at a flow rate of 100 sccm.

The pattern formation of the reflection electrode can be performed by using for example a wet etching process in which the Al film is processed with a solution containing 79% of phosphoric acid and 0.5% of sulfuric acid at 40° C. for 60 seconds.

Finally after the opposite substrate equipped with a transparent electrode and a color filter, and the active matrix substrate are formed with orientation films, respectively, the active matrix substrate is panel-aligned with the opposite substrate and a liquid crystal film is formed by filling the space therebetween with a liquid crystal material. Thus, the reflection type liquid crystal display device(not shown) is produced.

Figure 9:
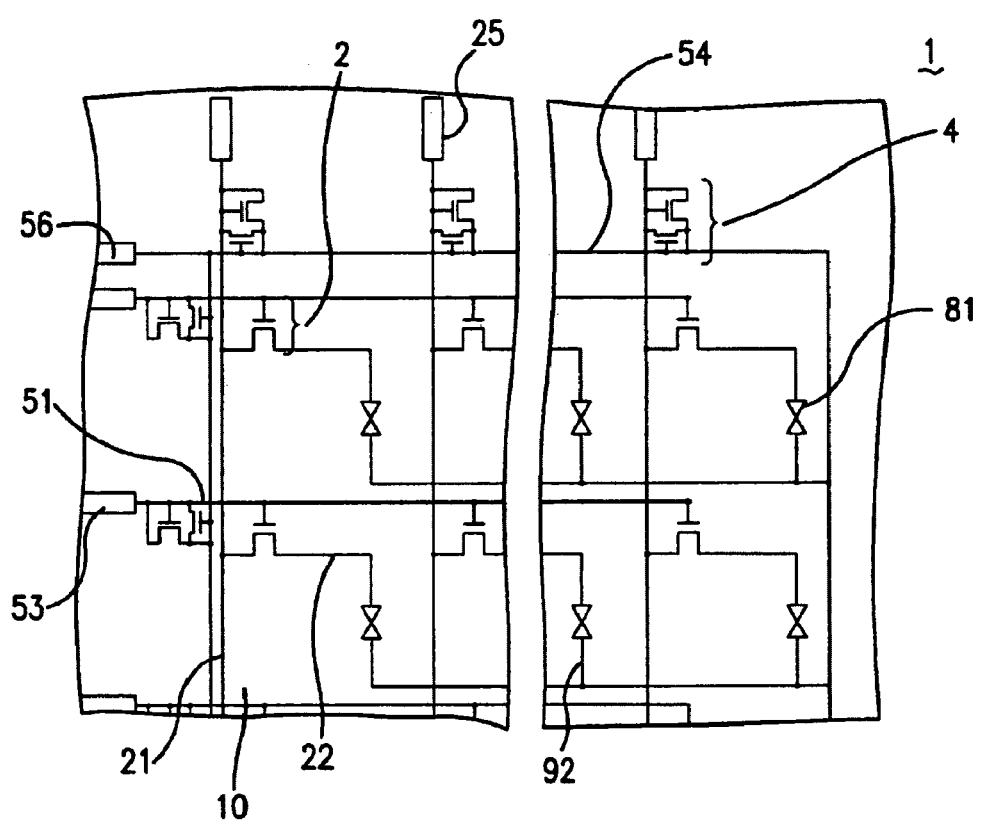
FIG. 9 is circuit diagram showing the active matrix substrate in the reflection type liquid crystal display device of the embodiment 2 of the present invention.

A second embodiment of the present invention will be described with reference to the drawings. FIG. 9 is a circuit diagram showing the active matrix substrate in the reflection type liquid crystal display device of the second embodiment of the present invention. FIG. 10 is a sectional view schematically showing a process for producing a transistor in the active matrix substrate in the reflection type liquid crystal display device of the second embodiment 2 of the present invention. FIGS. 11 to 16 are top plan views schematically showing a layout pattern for producing a protective circuit for the active matrix substrate in the reflection type liquid crystal display device of the embodiment 2 of the present invention. FIG. 17 is a sectional view schematically showing a process for the treatment of the surface of the interlayer insulating film of the active matrix substrate in the reflection type liquid crystal display device of the embodiment 2 of the present invention. In the active matrix substrate used for the reflection type liquid crystal display device, the storage capacitor shown in FIG. 1 is omitted and a protective circuit (protective element 4, protective terminal 56 and protective bus line 54) is provided. The structure of the transistor 2 is identical with that of the above described first embodiment. The process for forming contact holes is different from that in the first embodiment. The protective circuit is adapted to release an external excessive current due to electrostatic charges to a protective bus line 54 by turning on the protective element 4 so that the inner elements related with display are prevented from being damaged when excessive current is input thereto.

Now, a method for producing the transistor of the active matrix substrate in the reflection type liquid crystal display device of the second embodiment will be described with reference to FIGS. 10 to 17.

Figure 10A:
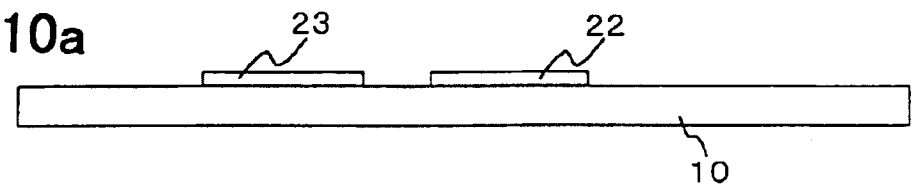
FIGS. 10a to 10f are sectional views each schematically showing the process for manufacturing the transistors of the active matrix substrate in the reflection type liquid crystal display device of the embodiment 2 of the present invention.
Figure 11:
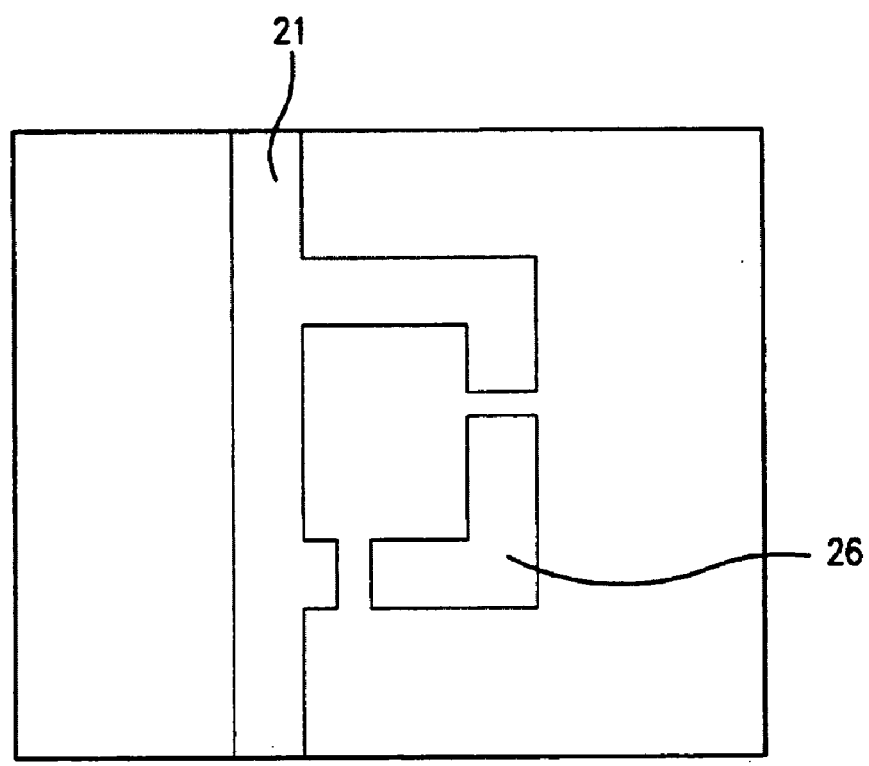
FIG. 11 is a first top plan view schematically showing the process for manufacturing the active matrix substrate in the reflection type liquid crystal display device of the embodiment 2 of the present invention.

As shown in FIG. 10a and FIG. 11, the source/drain electrodes 22, 23 (including drain bus line 21) and source/drain wiring 26 for the protective circuit are formed on the insulating substrate 10 of $SiO_2$ as is the case with the first embodiment. It is preferable to form a phosphorus film (not shown) on the surface of the source/drain electrodes and the like by conducting $PH_3$ processing after the formation of the source/drain electrode. The capacitor electrode is formed at this step if the storage capacitor is to be formed simultaneously therewith.

Figure 10B:
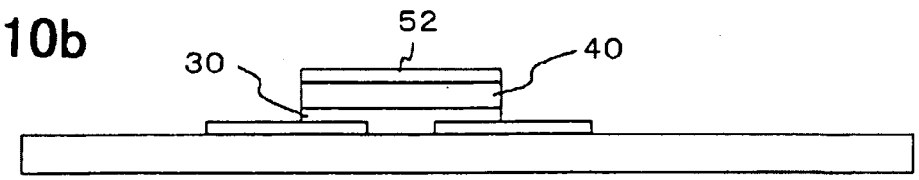
Figure 12:
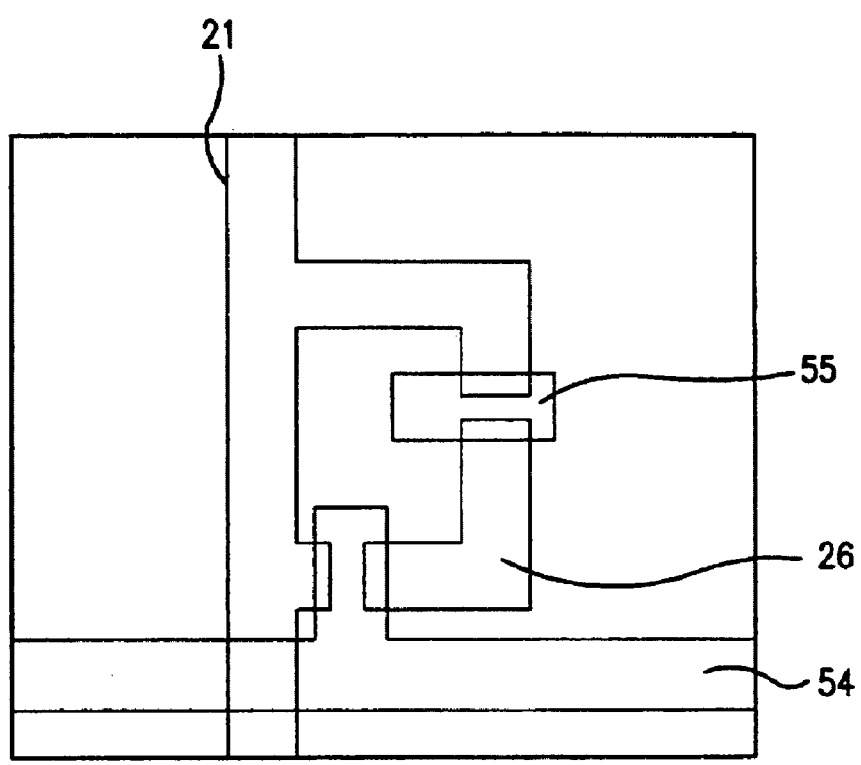
FIG. 12 is a second top plan view schematically showing the process for manufacturing the active matrix substrate in the reflection type liquid crystal display device of the embodiment 2 of the present invention.

Subsequently, the silicon layer 30, gate insulating film 40, gate electrode 52 (including gate bus line) and protective electrode 55 (including the protective line 54) are formed on the insulating substrate 10 so that they cover the respective one ends of the source/drain electrodes 22, 23 and the source/drain wiring 26 for the protective circuit in the same way as in first embodiment as shown in FIG. 10b and FIG. 12. Thus the transistor 2 and protective element 4 are formed. If the storage capacitor is to be formed simultaneously, a passivation film is also formed on the storage capacitor at this step.

Figure 10C:
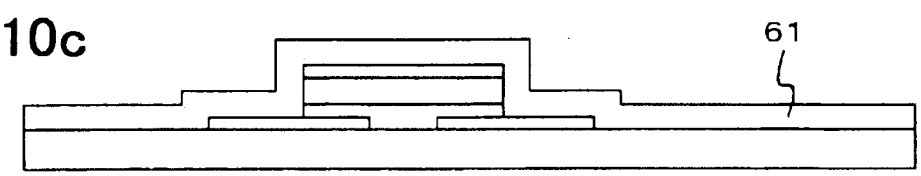
Figure 10D:
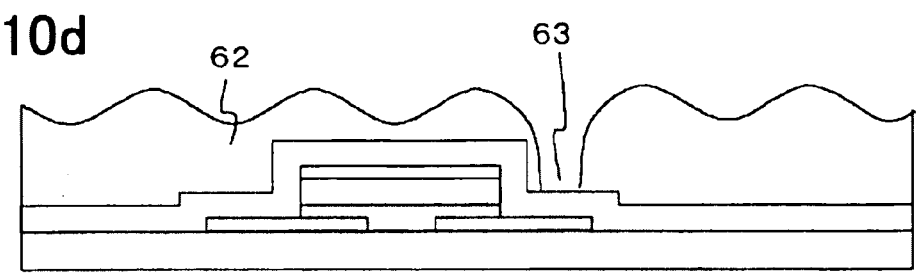
Figure 13:
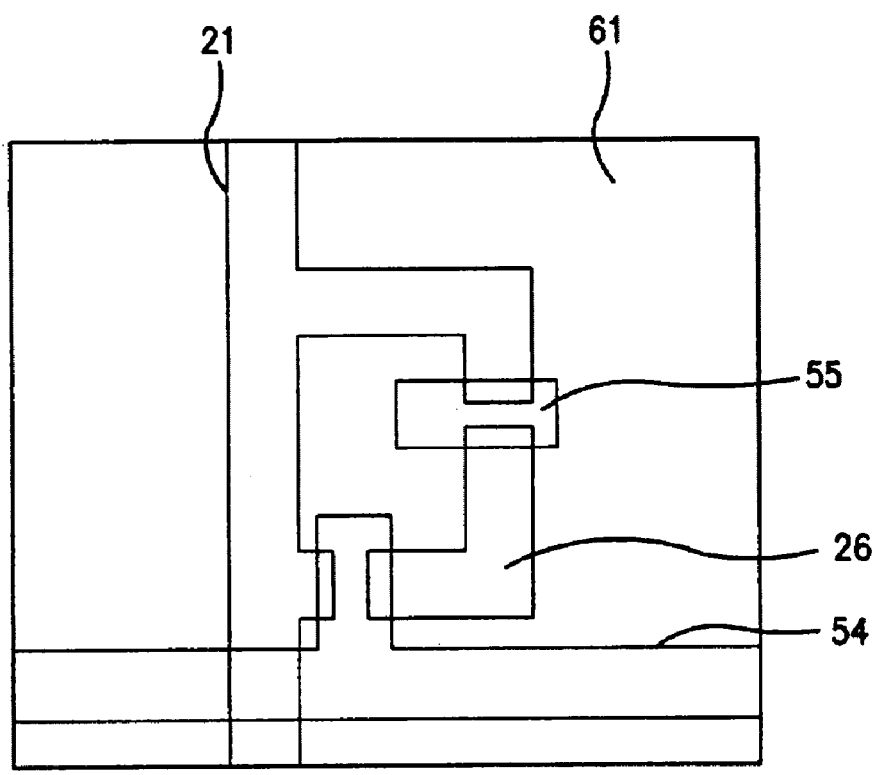
FIG. 13 is a third top plan view schematically showing the process for manufacturing the active matrix substrate in the reflection type liquid crystal display device of the embodiment 2 of the present invention.
Figure 14:
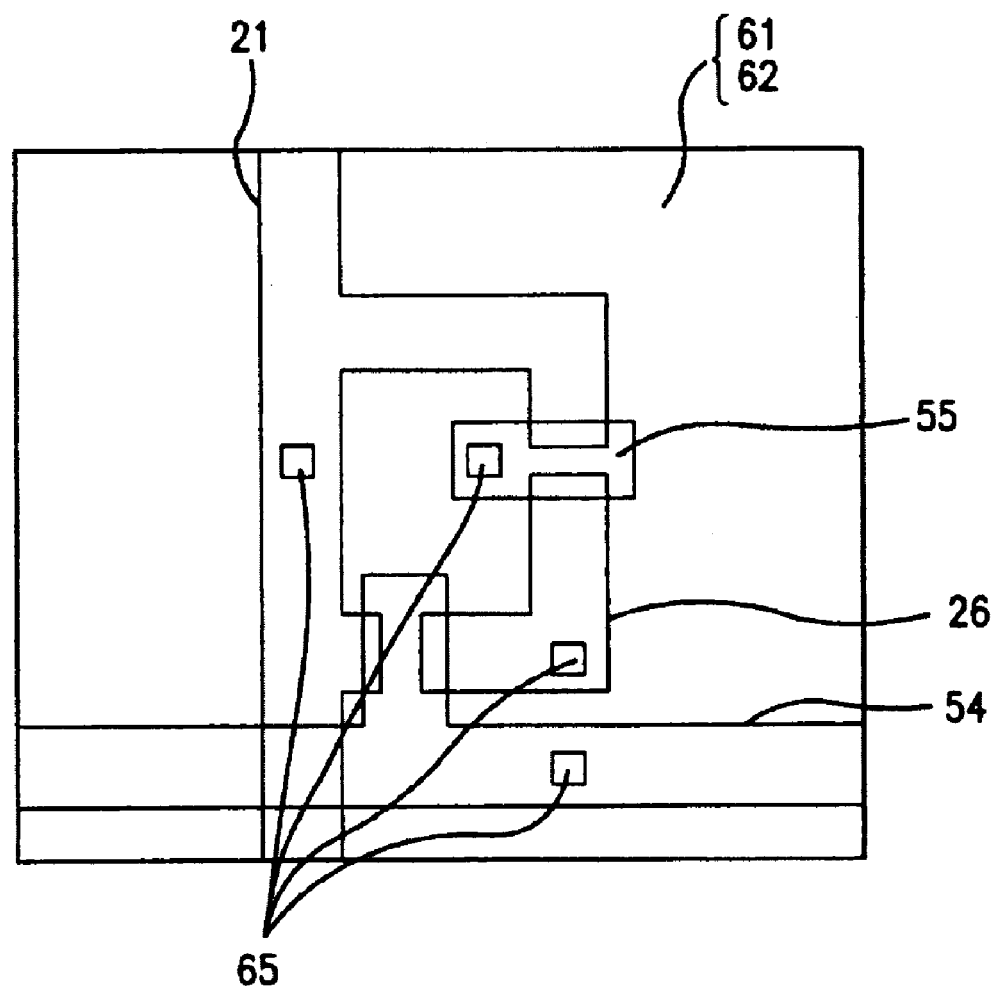
FIG. 14 is a fourth top plan view schematically showing the process for manufacturing the active matrix substrate in the reflection type liquid crystal display device of the embodiment 2 of the present invention.

Subsequently, as shown in FIGS. 10c and 13, a passivation film 61 of $SiN_x$ and the like is formed on the insulating substrate 10 using sputtering or CVD process so that it covers the transistors, drain bus line 21, gate bus line, protective electrode 55 and protective bus line 54 as is the case with the first embodiment. The second embodiment differs from the first embodiment in that the contact holes are not formed immediately after the formation of the passivation film 61. If the storage capacitor is also simultaneously formed, the passivation film is also formed on the storage capacitor at this step.

Subsequently, as shown in FIGS. 10d, 14 and FIGS. 17a to 17c, an inter-layer insulating film 62 of an organic material such as photosensitive acrylic resin, and polyimide resin is formed on the passivation film 62. The surface of the interlayer insulating film 62 is roughed and contact holes 63, 65 penetrating through the interlayer insulating film 62 are formed in positions on the passivation film 61 above the source electrode 22, drain bus line 22, protective electrode 55 and protective bus line 54 by a photolithography process and etching process using halftone exposure or two-time exposure. The second embodiment differs from the first embodiment in that the interlayer insulating film 62 is formed with contact holes (openings) before the formation of the contact holes. If the storage capacitor is also to formed simultaneously, the contact holes penetrating through the interlayer insulating film on the capacitor electrode is formed at this step.

Figure 10E:
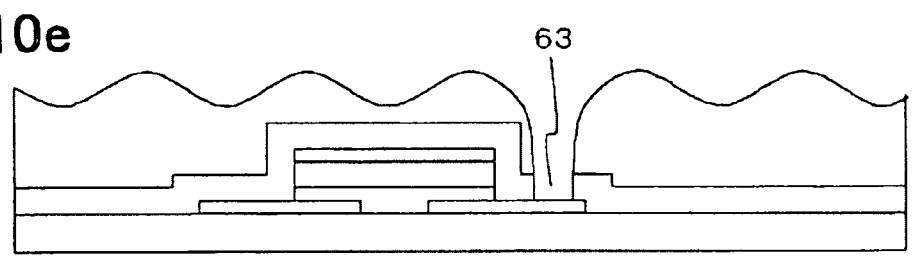
Figure 15:
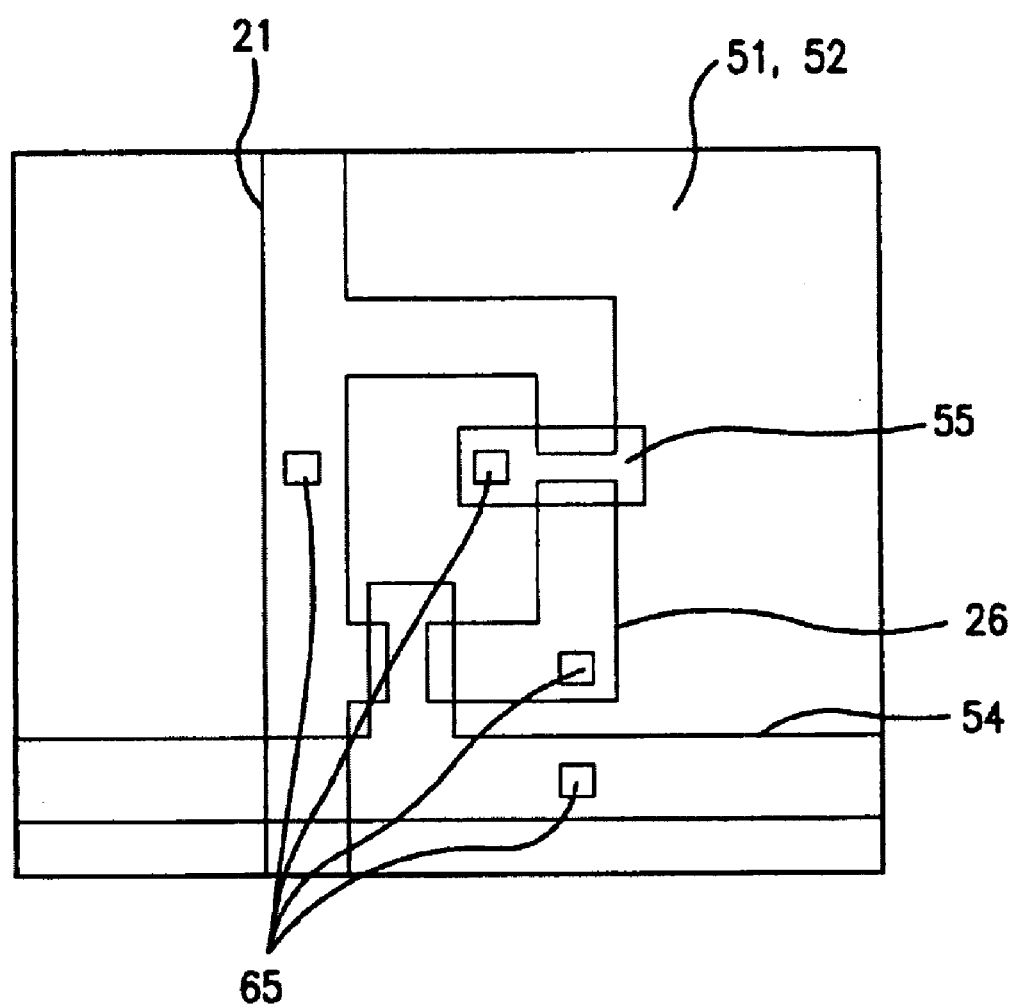
FIG. 15 is a fifth top plan view schematically showing the process for manufacturing the active matrix substrate in the reflection type liquid crystal display device of the embodiment 2 of the present invention.
Figure 17A:
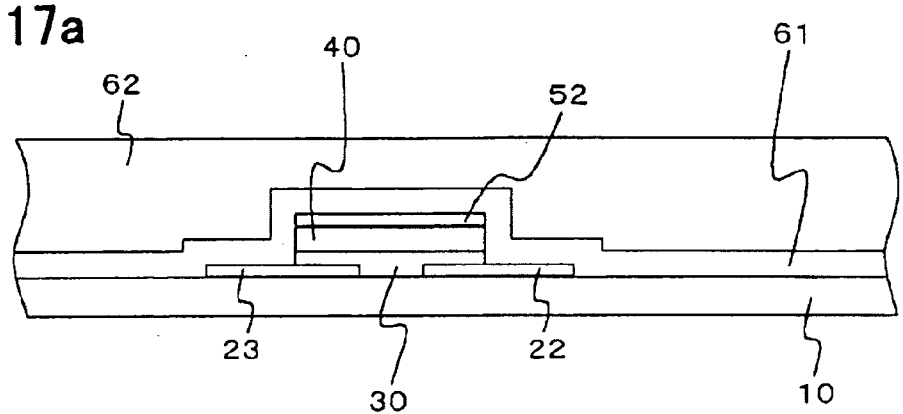
FIGS. 17a to 17d are sectional views each schematically showing the process for the surface treatment of the interlayer insulating film in the active matrix substrate in the reflection type liquid crystal display device of the embodiment 2 of the present invention.
Figure 17B:
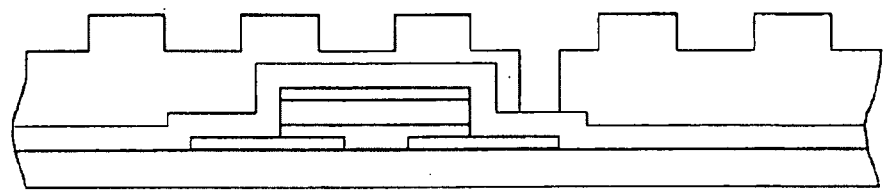
Figure 17C:
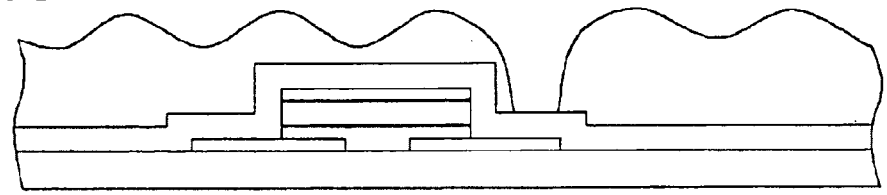
Figure 17D:
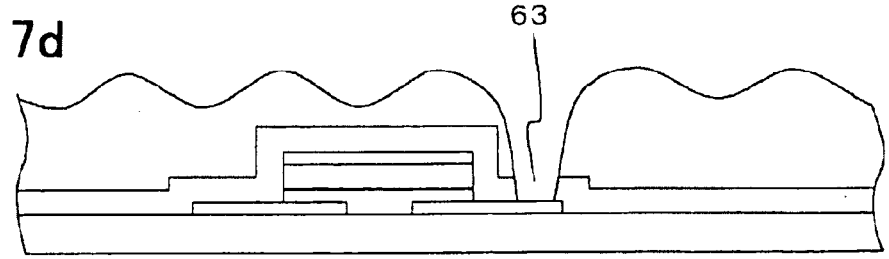
Figure 18:
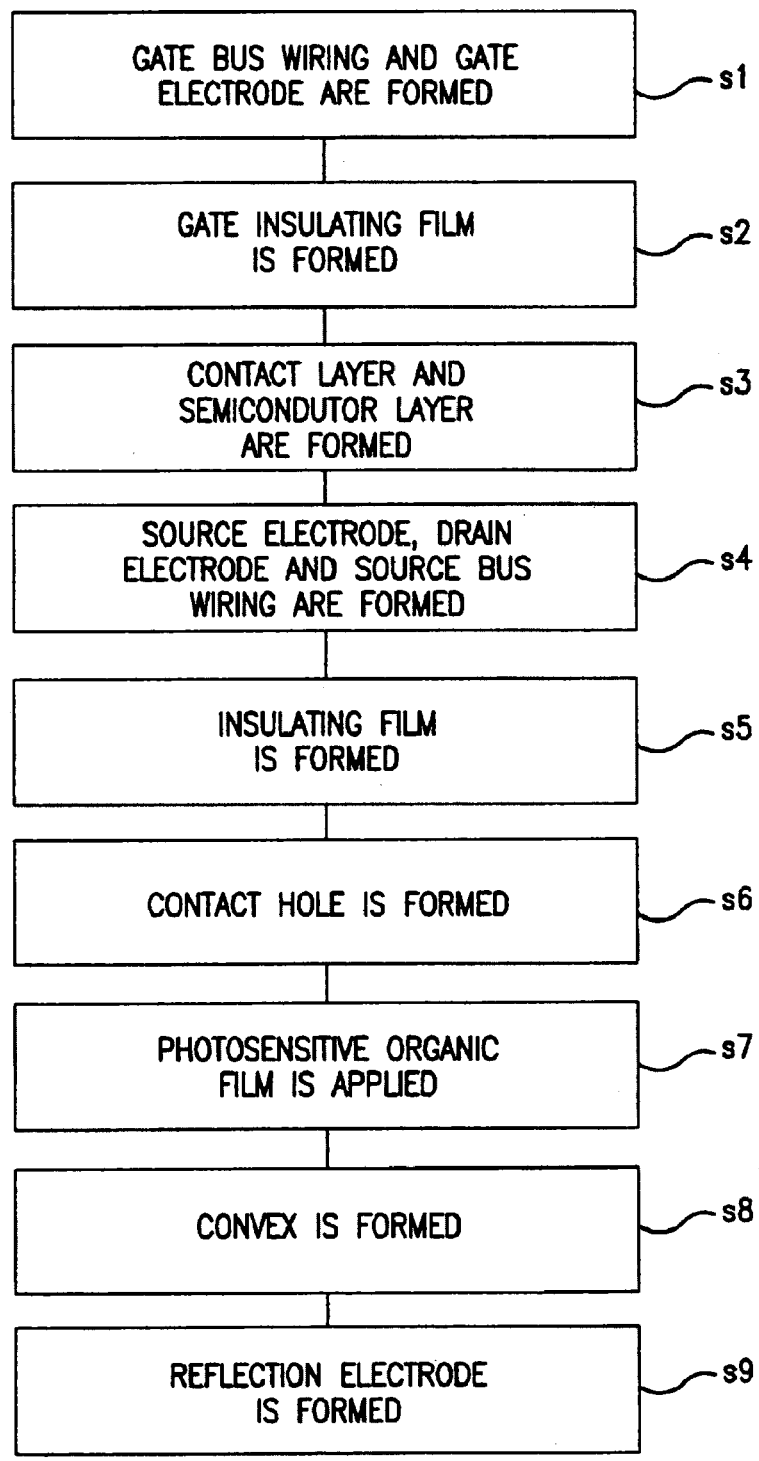
FIG. 18 is a flow chart showing a process for manufacturing the active matrix substrate in the prior art reflection type liquid crystal display device.

Subsequently, contact holes 63, 65 are formed which penetrates through the passivation film 61 in positions on the source electrode 22, drain bus line 21, protective electrode 55 and protective bus line 54 corresponding to the contact holes in the interlayer insulating film 62 by an etching process using the interlayer insulating film 62 having contact holes formed therein as a mask as shown in FIGS. 10e, 15 and 17d. Using this technique eliminates one PR process in comparison with the embodiment 1. If the storage capacitor is also formed simultaneously, contact holes extending through the passivation film on the capacitor electrode are formed at this step.

Figure 10F:
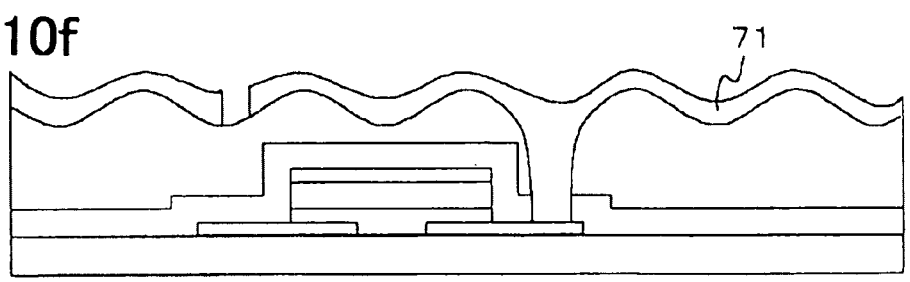
Figure 16:
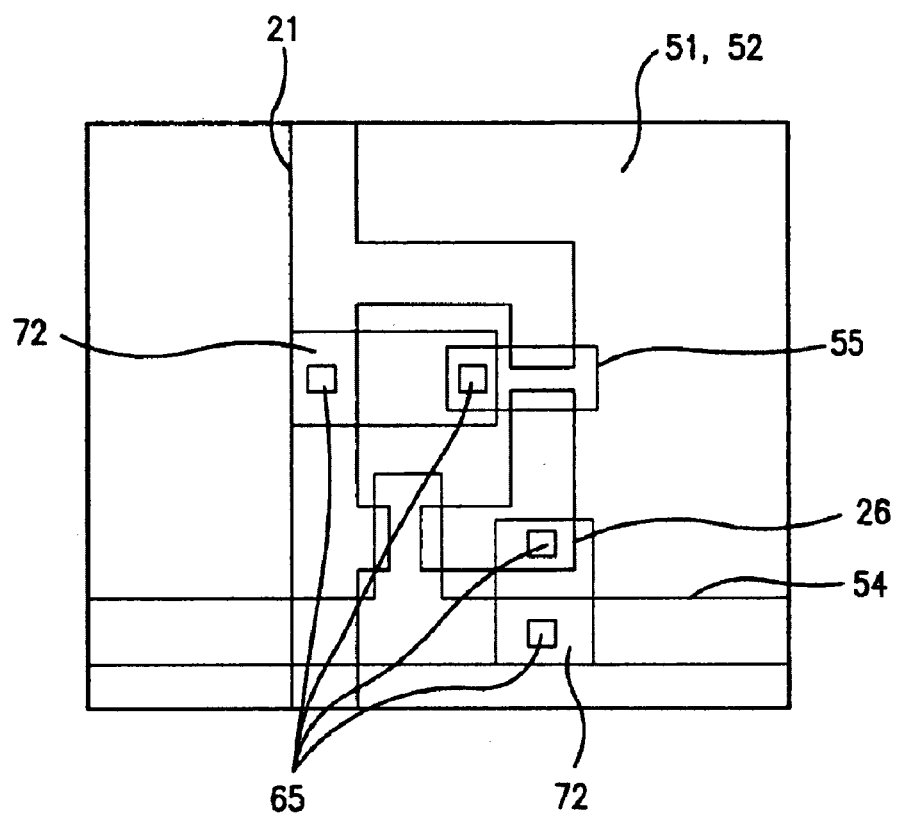
FIG. 16 is a sixth top plan view schematically showing the process for manufacturing the protective circuit in active matrix substrate in the reflection type liquid crystal display device of the embodiment 2 of the present invention.

Subsequently, as shown in FIGS. 10f and 16, a reflection electrode 71 and shortening wiring 72 are formed in position on the interlayer insulating film 62 as is the case with the first embodiment. The reflection electrode 71 is electrically connected to the source electrode 22. The shortening wiring 72 passes through given contact hole and is electrically connected to the source/drain wiring 26 and the protective bus line 54 for protection circuit. Another shortening wiring 72 separate from the former wiring 72 passes through given contact hole 65 and is electrically connected to the drain bus line 21 and the protective electrode 55. The reflective electrode 71 is at least formed in the opening of the liquid crystal panel. The reflection electrode 71 may be form din such a manner that it partially overlaps at its periphery on the transistor, gate bus line, and drain bus line. The active matrix substrate can be formed as mentioned above. If the storage capacitor is also formed simultaneously with this, the reflection electrode is electrically connected to the capacitor electrode.

Finally after the opposite substrate equipped with the transparent electrode and a color filter, and the active matrix substrate are formed with orientation films, respectively, the active matrix substrate is panel-aligned with the opposite substrate(termed color filter substrate) and a liquid crystal film is formed by filling the space therebetween with a liquid crystal material. Thus, the reflection type liquid crystal display device is produced (not shown).

The meritorious effects of the present invention are summarized as follows.

In accordance with the present invention, the number of steps of the photolithography process (PR) since the formation of the source/drain wiring until the formation of the reflection electrode in comparison with the prior art, so that shortening of the manufacturing period of time and reduction in a manufacturing cost is achieved because the silicon film, passivation film and gate electrode layer are successively etched in one photographic process and a new process is introduced in which roughing of the surface of the passivation film and the gate electrode layer and formation of contact holes is achieved by one PR process. Since the passivation film is etched by using the interlayer insulating film as a mask, the steps of PR process for etching the passivation film can be eliminated.

If the surface of the interlayer insulating film is roughed by PR and etching process using halftone exposure method in accordance with the present invention, the contour of the roughness can be freely controlled, so that excellent reflection characteristics can be obtained.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A process for producing a reflection type liquid crystal display device, comprising the steps of:
   (a) depositing a low resistance metal layer on an insulating substrate, and using a first mask to pattern the metal layer to form source/drain electrodes;
   (b) depositing a silicon layer, gate insulating film and gate electrode layer on said insulating substrate having said source/drain electrodes formed thereon in this order, and using a second mask to pattern the silicon layer, the gate insulating film and the gate electrode layer to form a thin film transistor region and a gate electrode;
   (c) depositing a passivation film on said insulating substrate having said source/drain electrodes, said thin film transistor region and said gate electrode formed thereon, and using a third mask to form a first opening through said passivation film to said source electrode;

(d) depositing an interlayer insulating film on said passivation film, forming a rough surface of said interlayer insulating film, and using a fourth mask to form a second opening through said interlayer insulating film at a position corresponding to the first opening;

(e) depositing a reflective metal over the rough surface of said interlayer insulating film to form a reflection electrode extended and electrically connected to said source electrode through the first and second openings (f) forming a first capacitor electrode when said source/drain electrodes are formed; and (g) forming a second capacitor electrode when said gate electrode layer is formed; and (h) forming a third opening for a storage capacitor through said interlayer insulating film and said passivation film in a position on said first capacitor electrode when the first and second openings are formed, wherein said reflection electrode extends through the third opening and is electrically connected to said first capacitor electrode.

2. The process as defined in claim 1, wherein the formation of the rough surface of said interlayer insulating film and the second opening is conducted by halftone exposure or two-times exposure.

3. The process as defined in claim 2, wherein the formation of the rough surface of said interlayer insulating film and the second opening is conducted by using the fourth mask having controlled transmissivity.

4. The process as defined in claim 1, further comprising the step of heat treating at least the rough surface of said interlayer insulating film before depositing said reflective metal and after forming the rough surface of said interlayer insulating film.

5. The process as defined in claim 1, further comprising the step of treating at least said source/drain electrodes with $PH_3$ after said source/drain electrodes are formed and prior to successive deposition of said silicon layer, gate insulating film and gate electrode layer.

* * * * *